United States Patent
Lee et al.

(10) Patent No.: US 9,711,939 B2
(45) Date of Patent: Jul. 18, 2017

(54) SEMICONDUCTOR OPTICAL DEVICE

(71) Applicant: ELECTRONICS AND TELECOMMUNICATIONS RESEARCH INSTITUTE, Daejeon (KR)

(72) Inventors: Dong Hun Lee, Sejong-si (KR); Sang Ho Park, Daejeon (KR); Yong Soon Baek, Daejeon (KR); Jang Uk Shin, Daejeon (KR); Young Tak Han, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/241,362

(22) Filed: Aug. 19, 2016

(65) Prior Publication Data
US 2017/0179679 A1    Jun. 22, 2017

(30) Foreign Application Priority Data

Dec. 16, 2015 (KR) .................. 10-2015-0180275

(51) Int. Cl.
*G02B 6/12* (2006.01)
*H01S 5/22* (2006.01)
(Continued)

(52) U.S. Cl.
CPC .......... *H01S 5/026* (2013.01); *G02B 6/12004* (2013.01); *G02B 6/1228* (2013.01);
(Continued)

(58) Field of Classification Search
None
See application file for complete search history.

(56) References Cited

U.S. PATENT DOCUMENTS

| | | | |
|---|---|---|---|
| 8,804,232 B2 | 8/2014 | Kim et al. | |
| 2012/0281274 A1* | 11/2012 | Kim ............... | H01S 5/0265 359/344 |

(Continued)

FOREIGN PATENT DOCUMENTS

| | | |
|---|---|---|
| KR | 10-2012-0124548 A | 11/2012 |
| KR | 10-2013-0071749 A | 7/2013 |

OTHER PUBLICATIONS

Hyun-Soo Kim et al., "10 Gb/s REAM-SOA for low cost WDM-PON", Optical Fiber Communication Conference and Exposition and the National Fiber Optic Engineers Conference (OFC/NFOEC), Mar. 6-10, 2011, pp. 1-3.

*Primary Examiner* — Hemang Sanghavi
(74) *Attorney, Agent, or Firm* — Rabin & Berdo, P.C.

(57) ABSTRACT

Provided herein is a semiconductor optical device, including a waveguide including lattices buried therein and having a buried hetero (BH) structure formed in an optical oscillation region in which single mode light is oscillated, a waveguide having a deep ridge structure formed in an optical modulation region, and a passive waveguide formed in a mode transition region interposed between the optical oscillation region and the optical modulation region, formed as a connecting structure of the waveguide having the BH structure extending from the optical oscillation region and the waveguide having the deep ridge structure extending from the optical modulation region, and inducing evanescent optical coupling, wherein a width of the waveguide having the BH structure in the mode transition region is smaller than a width of the waveguide having the deep ridge structure in the optical modulation region.

12 Claims, 14 Drawing Sheets

(51) Int. Cl.
  *H01S 5/026* (2006.01)
  *H01S 5/00* (2006.01)
  *H01S 5/343* (2006.01)
  *G02F 1/017* (2006.01)
  *G02B 6/14* (2006.01)
  *G02B 6/122* (2006.01)
  *G02F 1/015* (2006.01)
(52) U.S. Cl.
  CPC ............ *G02B 6/14* (2013.01); *G02F 1/01708* (2013.01); *H01S 5/0064* (2013.01); *H01S 5/0085* (2013.01); *H01S 5/2223* (2013.01); *H01S 5/343* (2013.01); *G02F 2001/0157* (2013.01)

(56) References Cited

U.S. PATENT DOCUMENTS

| | | | |
|---|---|---|---|
| 2012/0307857 A1* | 12/2012 | Oh | H01L 33/0045 372/46.01 |
| 2013/0016942 A1* | 1/2013 | Gubenko | G02B 6/1228 385/14 |
| 2015/0010274 A1 | 1/2015 | Park | |
| 2015/0115219 A1 | 4/2015 | Oh et al. | |

\* cited by examiner

US 9,711,939 B2

SEMICONDUCTOR OPTICAL DEVICE

CROSS-REFERENCE TO RELATED APPLICATION

The present application claims priority to Korean patent application number 10-2015-0180275 filed on Dec. 16, 2015, the entire disclosure of which is incorporated herein in its entirety by reference.

BACKGROUND

Field of Invention

Various embodiments of the inventive concept of the present disclosure relate to a semiconductor optical device, and more particularly, to an optical waveguide structure.

Description of Related Art

An optical waveguide structure provides an optical transmission path for optical signal transmission. Various methods for processing an optical signal have been developed in the field of optical communications using optical signals. For example, a semiconductor optical device in which a high output light source capable of transmitting a high-speed optical signal at a long distance and an optical modulator operating at a high rate are integrated into a single unit, such as an electroabsorption modulator integrated DFB laser (EA-DFB), has been developed. A waveguide for high optical output characteristics and low threshold current characteristics may have a different structure from a waveguide for high-speed modulation characteristics.

As described above, when an optical waveguide structure is implemented by combining different types of waveguides, a difference in optical mode size and a difference in effective refractive index may occur due to the structural difference between the different types of waveguides. Therefore, when a single integrated optical device is manufactured by combining different types of waveguides, optical loss in the optical device may be increased due to the difference in optical propagation mode between the waveguides. As a result, optical output of an optical device may be deteriorated. In addition, the difference in effective refractive index between the different types of waveguides may result in optical refection in the optical device. The optical reflection in the optical device may interfere with wavelength stabilization of the optical device and deteriorate yield of the optical device.

SUMMARY

Various embodiments of the present disclosure provide an optical device capable of improving optical coupling loss between different types of waveguides.

According to an embodiment, there is provided a semiconductor optical device, including a BH waveguide including lattices buried therein and having a buried hetero (BH) structure formed in an optical oscillation region in which single mode light is oscillated, a deep ridge waveguide having a deep ridge structure formed in an optical modulation region, and a passive waveguide formed in a mode transition region interposed between the optical oscillation region and the optical modulation region, formed as a connecting structure of the BH waveguide extending from the optical oscillation region and the deep ridge waveguide extending from the optical modulation region, and inducing evanescent optical coupling, wherein a width of the BH waveguide in the mode transition region is smaller than a width of the deep ridge waveguide in the optical modulation region.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
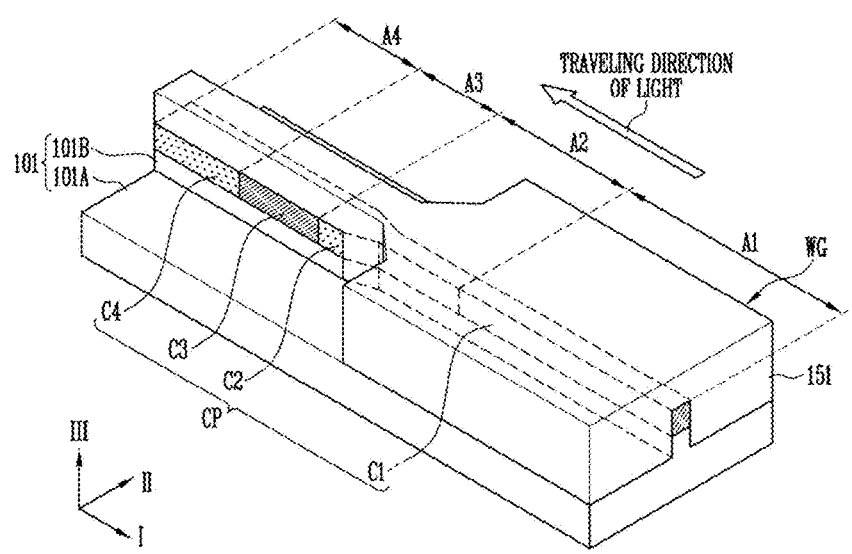
FIG. 1 is a perspective view illustrating a semiconductor optical device according to an embodiment.

Specific structural or functional descriptions of exemplary embodiments in accordance with a concept of the present invention which are disclosed in this specification are illustrated only to describe the exemplary embodiments in accordance with the concept of the present invention and the exemplary embodiments in accordance with the concept of the present invention may be carried out by various forms but the present invention is not limited to the exemplary embodiments described in this specification. Various modifications and changes may be applied to the exemplary embodiments in accordance with the concept of the present invention so that the exemplary embodiments will be illustrated in the drawings and described in detail in the specification. However, the exemplary embodiments according to the concept of the present invention is not limited to the specific embodiments, but includes all changes, equivalents, or alternatives which are included in the spirit and technical scope of the present invention.

Figure 2:
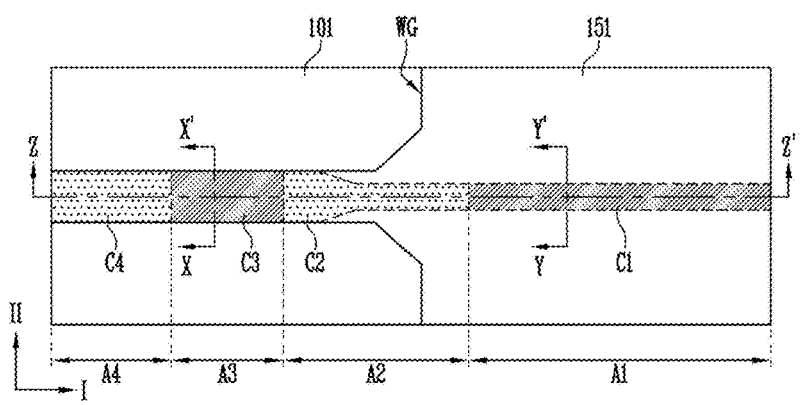
FIG. 2 is a plan view illustrating a semiconductor optical device according to an embodiment.

FIG. 1 is a perspective view illustrating a semiconductor optical device according to an embodiment. FIG. 2 is a plan view illustrating a semiconductor optical device according to an embodiment. An optical device according to an embodiment may be an electroabsorption modulated laser (EML).

Referring to FIGS. 1 and 2, a semiconductor optical device according to an embodiment may include an optical waveguide structure WG having an optical oscillation region A1, a first mode transition region A2, an optical modulation region A3 and a second mode transition region A4 that are arranged in a row in a traveling direction of light. The optical waveguide structure WG may include a lower clad pattern 101, an upper clad pattern 151, and a core pattern CP between the lower clad pattern 101 and the upper clad pattern 151.

The core pattern CP may include a first core portion C1 arranged in the optical oscillation region A1, a second core portion C2 arranged in the first mode transition region A2, a third core portion C3 arranged in the optical modulation region A3, and a fourth core portion C4 arranged in the second mode transition region A4. The first to fourth core portions C1 to C4 may be integrated into a single pattern by a butt-joint method. A portion of the core pattern CP may be patterned so that a width thereof may increase in the traveling direction of light. For example, the first core portion C1 may have a uniform width in the optical oscillation region A1. A portion of the second core portion C2 may include a first taper structure whose width increases in the traveling direction of light. Both ends of the second core portion C2 coupled to both ends of the first taper structure t may have different widths. One end of the second core portion C2 adjacent to the first core portion C1 may have the same width as the first core portion C1, and the other end of the second core portion C2 adjacent to the third core portion C3 may have the same width as the third core portion C3. The width of each of the third core portion C3 and the fourth core portion C4 may be greater than that of the first core portion C1. Each of the third core portion C3 and the fourth core portion C4 may have a uniform width.

The lower clad pattern 101 may include a first lower clad layer 101A and a second lower clad layer 101B. The second lower clad layer 101B may be arranged on the first lower clad layer 101A and patterned into the same shape as the core pattern CP.

A portion of the upper clad pattern 151 may include a second taper structure whose width decreases in the traveling direction of light. For example, the upper clad pattern 151 may be formed to have a uniform width in the optical oscillation region A1. A portion of the upper clad pattern 151 may have a second taper structure whose width decreases in the traveling direction of light in the first mode transition region A2. The second taper structure and the first taper structure may not overlap with each other. The second taper structure may be closer to the optical oscillation region A1 than the first taper structure. The upper clad pattern 151 may include a portion patterned into the same shape as the second core portion C2 and a portion having a greater width than the second core portion C2 in the first mode transition region A2. The upper clad pattern 151 may be patterned into the same shape as the third core portion C3 and the fourth core portion C4 in the optical modulation region A3 and the second mode transition region A4.

The optical waveguide structure WG may have different structures in the optical oscillation region A1 and the optical modulation region A3. More specifically, in the optical oscillation region A1, the optical waveguide structure WG may have a buried hetero (BH) structure for high optical output characteristics and low threshold current characteristics. Since the BH structure has low optical loss characteristics and efficient current injection characteristics, it is appropriate for lower power consumption. In the optical modulation region A3, the optical waveguide structure WG may be formed to have a deep ridge structure with low capacitance for high speed modulation characteristics.

In the optical oscillation region A1, the BH structure may form a distributed feedback laser diode (DFB-LD) which generates a continuous wave (CW). In the optical modulation region A3, the deep ridge structure may form an electro-absorption modulator (EAM) for modulating a CW optical signal. Thus, the optical device according to the embodiment may generate a high-speed optical signal having a single wavelength.

The first mode transition region A2 may be arranged between the optical oscillation region A1 and the optical modulation region A3. In the first mode transition region A2, the optical waveguide structure WG may include the BH structure extending from the optical oscillation region A1 and the optical modulation region A3 extending from the deep ridge structure. In other words, the BH structure and the deep ridge structure may be connected to each other in the first mode transition region A2.

In the second mode transition region A4, the optical waveguide structure WG may include the deep ridge structure extending from the optical modulation region A3. The first mode transition region A2 and the second mode transition region A4 may include a passive waveguide.

In the BH structure, a sidewall and an upper surface of the core pattern CP may be covered by the upper clad pattern 151. In the deep ridge structure, the sidewall of the core pattern CP may not be covered by the upper clad pattern 151, and the sidewall of the core pattern CP and a sidewall of the upper clad pattern 151 may be formed in the same plane.

The optical waveguide structure WG including the BH structure and the deep ridge structure as described above may be formed by controlling the width of the core pattern CP and the width of the upper clad pattern 151.

The passive waveguide connected to the BH structure extending from the optical oscillation region A1 and the deep ridge structure extending from the optical modulation region A3 may be defined in the first mode transition region A2. The passive waveguide may be arranged between the optical oscillation region A1 and the optical modulation region A3 to increase optical coupling efficiency and reduce internal optical reflection. The first mode transition region A2 including the passive waveguide may prevent generation of multi-mode light and increase an allowable misalignment range between the BH structure and the deep ridge structure that may occur during processes, so that a semiconductor optical device having a high yield and a method of manufacturing the same may be provided. The first mode transition region A2 including the passive waveguide may offer high optical coupling efficiency and high electrical isolation characteristics.

When the optical oscillation region A1 having the BH structure and the optical modulation region A3 having the deep ridge structure are directly coupled to each other without the first mode transition region A2 including the passive waveguide, optical loss and optical reflection may occur due to the difference in effective refractive index between the BH structure and the deep ridge structure. According to an embodiment, the first mode transition region A2 including the passive waveguide is arranged between the optical oscillation region A1 of the BH structure and the optical modulation region A3 of the deep ridge structure to inhibit multi-mode light and induce evanescent optical coupling. A detailed description of the evanescent optical coupling and the multi-mode light inhibition will be provided below with reference to FIG. 4.

Figure 3A:
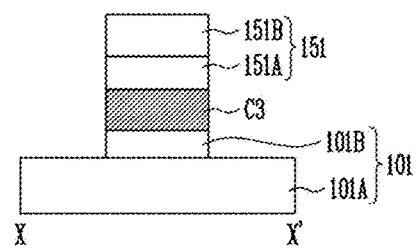
FIGS. 3A to 3C are cross-sectional views taken along lines "X-X'", "Y-Y'", and "Z-Z'" of FIG. 2.
Figure 3B:
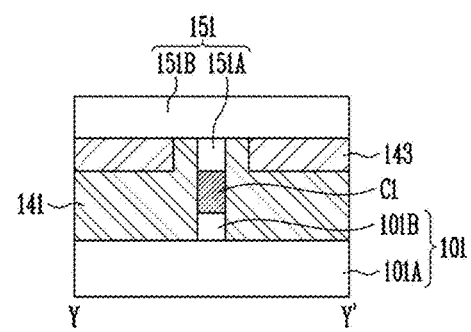
Figure 3C:
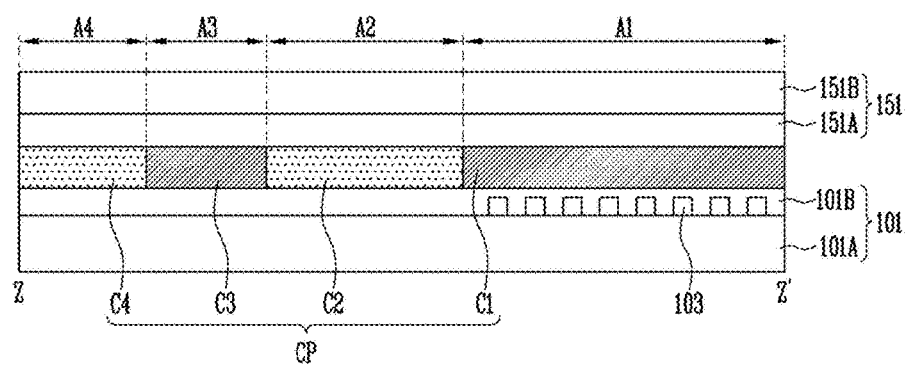

FIGS. 3A to 3C are cross-sectional views taken along lines "X-X'", "Y-Y'", and "Z-Z'" of FIG. 2.

Referring to FIGS. 3A to 3C, the optical waveguide structure WG may include the core pattern CP arranged between the lower clad pattern 101 and the upper clad pattern 151.

The lower clad pattern 101 may include the first lower clad layer 101A and the second lower clad layer 101B having the same composition as the first lower clad layer 101A. The second lower clad layer 101B may be arranged on the first lower clad layer 101A. The second lower clad layer 101B may be patterned into the same shape as the core pattern CP. The upper clad pattern 151 may include a first upper clad layer 151A and a second upper clad layer 151B having the same composition as the first upper clad layer 151A. The second upper clad layer 151B may be arranged on the first upper clad layer 151A. Each of the lower clad pattern 101 and the upper clad pattern 151 may include a material having a higher refractive index than the core pattern CP.

The core pattern CP may include the first to fourth core portions C1 to C4 that are optically coupled by a butt-joint method and integrated into a single pattern. The thickness and composition of each of the first to fourth core portions C1 to C4 may be determined in consideration of an effective refractive index to reduce optical coupling loss and internal reflection at a butt-joint surface. The core pattern CP may be arranged on the lower clad pattern 101. A portion of the core pattern CP may be surrounded by a current interrupting structure including the upper clad pattern 151 and first and second current interrupting clad patterns 141 and 143. More specifically, a portion of the second core portion C2 having a smaller width than the upper clad pattern 151 and the first core portion C1 may be surrounded by the current interrupting structure having a PNP structure consisting of the first current interrupting clad pattern 141, the second current interrupting clad pattern 143 and the upper clad pattern 151. The first current interrupting clad pattern 141 may be formed along the shape of the sidewall of the core pattern CP and the upper surface of the first lower clad layer, and the second current interrupting clad pattern 143 may be arranged between the upper clad pattern 151 and the first current interrupting clad pattern 141.

The core pattern CP may include a compound semiconductor such as InGaAsP, InGaAs, InAlGaAs, or InAlAs. The upper clad pattern 151 and the lower clad pattern 101 may include InP. The first and third core portions C1 and C3 may have a multiple quantum well structure, and the second and fourth core portions C2 and C4 may include a bulk structure.

Though not illustrated, a p-InGaAs ohmic layer and a p-electrode may be further formed on the upper clad pattern 151, and an n-electrode may be further formed on the lower clad layer 101A in order to inject current into the optical oscillation region A1 and apply bias to the optical modulation region A3.

A plurality of lattices 103 may be buried in the second lower clad layer 101B under the first core portion C1. Light generated from the multiple quantum well structure of the first core portion C1 may be oscillated as a coherent laser beam filtered through the lattices 103. The light oscillated in the optical oscillation region A1 may be a distributed feedback laser. The light oscillated in the optical oscillation region A1 may pass through the first mode transition region A2 and be optically coupled in the optical modulation region A3. Hereinafter, the light passing through the first mode transition region A2 will be described in detail with reference to FIG. 4.

Figure 4:
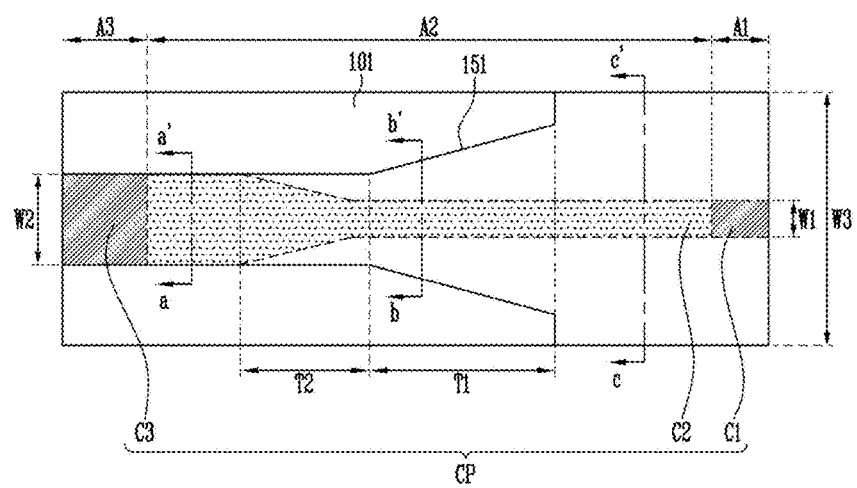
FIG. 4 is an enlarged plan view of a first mode transition region of a semiconductor optical device according to an embodiment.

FIG. 4 is an enlarged plan view of a first mode transition region of a semiconductor optical device according to an embodiment.

Referring to FIG. 4, the core pattern CP may extend from the optical oscillation region A1 to the optical modulation region A3. The core pattern CP may have a first width W1 in the optical oscillation region A1. The first width W1 of the core pattern CP may be maintained in a portion of the first mode transition region A2. The core pattern CP may have a taper shape so that the width thereof in the first mode transition region A2 may increase toward the optical modulation region A3. The core pattern CP may extend and have a second width W2 greater than the first width W1 at one end of the first mode transition region A2 next to the optical modulation region A3. For example, the first width W1 may be 1 μm and the second width W2 may be 2 μm to 3 μm. The second width W2 of the core pattern CP may be maintained in the optical modulation region A3 and the second mode transition region A4.

The upper clad pattern 151 may extend from the optical modulation region A3 toward the optical oscillation region A1. The upper clad pattern 151 may have the second width W2 in the optical modulation region A3, and the second width W2 of the upper clad pattern 151 may be maintained in a portion of the first mode transition region A2. The upper clad pattern 151 may extend with the second width W2 from the optical modulation region A3 to the upper taper shape of the core pattern CP so as to cover the taper shape of the core pattern CP formed in the first mode transition region A2. The upper clad pattern 151 may have a taper shape so that the width thereof in the first mode transition region A2 may increase toward the optical oscillation region A1. The upper clad pattern 151 may extend to have a third width W3 greater than the second width W2 at the other end of the first mode transition region A2 next to the optical oscillation region A1. The third width W3 of the upper clad pattern 151 may be maintained in the optical oscillation region A1.

A waveguide having a BH structure may be defined at a portion where the upper clad pattern 151 has a greater width than the core pattern CP. A waveguide having a deep ridge structure may be defined at a portion where the upper clad pattern 151 and the core pattern CP have the same width. The waveguide of the BH structure and the waveguide of the deep ridge structure may be connected in the first mode transition region A2. The waveguide having the BH structure may be divided into first to third portions in the first mode transition region A2. The first portion may extend with a uniform width from the optical oscillation region A1. The second portion may extend from the first portion and have a width decreasing toward the optical modulation region A3. The second portion may correspond to a first transition region T1. The third portion may extend from the second portion so as to be connected to the waveguide having the deep ridge structure extending from the optical modulation region A3, and have a width increasing toward the waveguide of the deep ridge structure. The third portion may correspond to a second transition region T2.

Single-mode light generated in the optical oscillation region A1 including the waveguide having the BH structure may pass through a butt-joint interface between the first core portion C1 and the second core portion C2 of the core pattern CP and move toward the passive waveguide of the BH structure defined in the first mode transition region A2. Light passing through the passive waveguide of the BH structure defined in the first mode transition region A2 may pass through the first transition region T1 and the second transition region T2 and be optically coupled in the deep ridge waveguide. As the single mode light passes through the first transition region T1 gradually decreasing in width, an optical spot thereof may be reduced to an intermediate size between the BH structure and the deep ridge structure. The light having the reduced spot size may pass through the second transition region T2 increasing in width, form evanescent optical coupling in the deep ridge waveguide, pass through a butt-joint interface between the second core portion C2 and the third core portion C3, and be optically coupled in the optical modulation region A3.

According to an embodiment, by controlling optical spot size and inducing evanescent optical coupling by a passive waveguide, optical loss caused by the difference in waveguide structure between the optical oscillation region A1 and the optical modulation region A3 may be reduced and optical coupling efficiency may be increased.

Figure 5A:
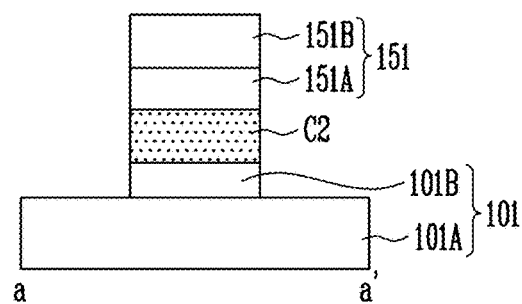
FIGS. 5A to 5C are cross-sectional views taken along lines "a-a'", "b-b'", and "c-c'" shown in FIG. 4.
Figure 5B:
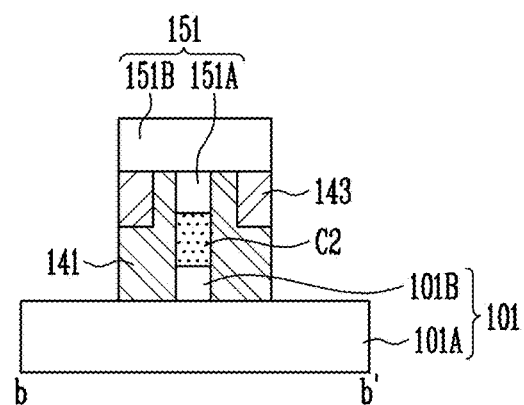
Figure 5C:
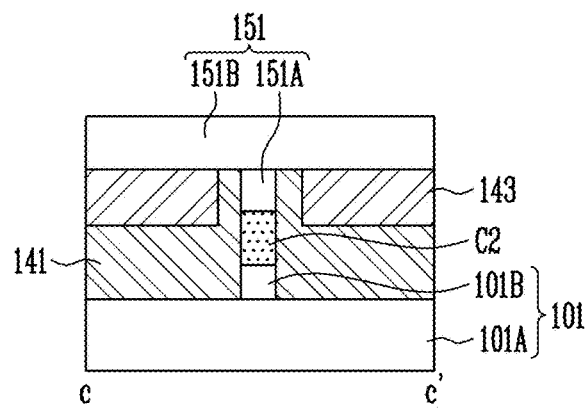

FIGS. 5A to 5C are cross-sectional views taken along lines "a-a'", "b-b'", and "c-c'" of FIG. 4.

Referring to FIGS. 5A to 5C, the passive waveguide may include the lower clad pattern 101 including the first and second lower clad layers 101A and 101B, the upper clad pattern 151 including the first and second upper clad layers 151A and 151B, and the second core portion C2 between the lower clad pattern 101 and the upper clad pattern 151.

As shown in FIG. 5A, the upper clad pattern 151 and the second core portion C2 may be patterned into the same shape at one end of the passive waveguide toward the optical modulation region A3. The sidewall of the upper clad pattern 151 and the sidewall of the second core portion C2 may be arranged in the same plane. As a result, one end of the passive waveguide toward the optical modulation region A3 may be formed into a deep ridge structure.

As illustrated in FIGS. 5B and 5C, the upper clad pattern 151 forming a portion of the passive waveguide in the first and second transition regions T1 and T2 and the other end of the passive waveguide toward the optical oscillation region A1 may be patterned into a greater width than the second core portion C2. In addition, the second core portion C2 may be surrounded by the current interrupting structure including the upper clad pattern 151 and the first and second current interrupting clad patterns 141 and 143. As a result, the portion of the passive waveguide in the first and second transition regions T1 and T2 and the other end of the passive waveguide toward the optical oscillation region A1 may be formed to have a BH structure.

The lower clad pattern 101 may include InP doped with n type impurities. The upper clad pattern 151 may include undoped InP to reduce optical loss of the waveguide. In addition, the upper clad pattern 151 may include InP doped with p type impurities. The upper clad pattern 151 and the first and second current interrupting clad patterns 141 and 143 may include InP dope with impurities so as to define a current interrupting structure having a PNP structure.

Figure 6:
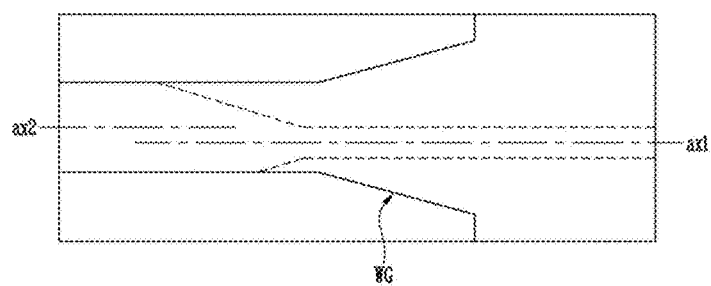
FIG. 6 is a view illustrating an optical axis misalignment of a deep ridge waveguide and a buried hetero (BH) waveguide.

FIG. 6 is a diagram illustrating an optical axis misalignment of a deep ridge waveguide and a BH waveguide.

Referring to FIG. 6, when the optical waveguide structure WG including the deep ridge waveguide and the BH waveguide is formed using a photolithography process, a horizontal misalignment of approximately 0.5 μm may occur between an optical axis ax1 of the deep ridge waveguide and an optical axis ax2 of the BH waveguide. Such misalignment may cause multi-mode light to be guided when light is guided to the deep ridge waveguide having a high optical confinement factor.

The multi-mode light may increase optical loss in a deep ridge waveguide region to deteriorate optical output of the semiconductor optical device.

According to an embodiment, a portion of the second core portion C2 may have a smaller width than the third core portion C3 in the first mode transition region A2 forming the passive waveguide as shown in FIG. 4. Therefore, according to an embodiment, excitation of multi-mode light may be prevented in the first and second transition regions T1 and T2 and the deep ridge waveguide region as shown in FIG. 4, optical loss in the semiconductor optical device may be reduced, and optical coupling efficiency of optical fibers and a device may be maximized. As a result, a manufacturing yield of a semiconductor optical device may be improved.

Figure 7A:
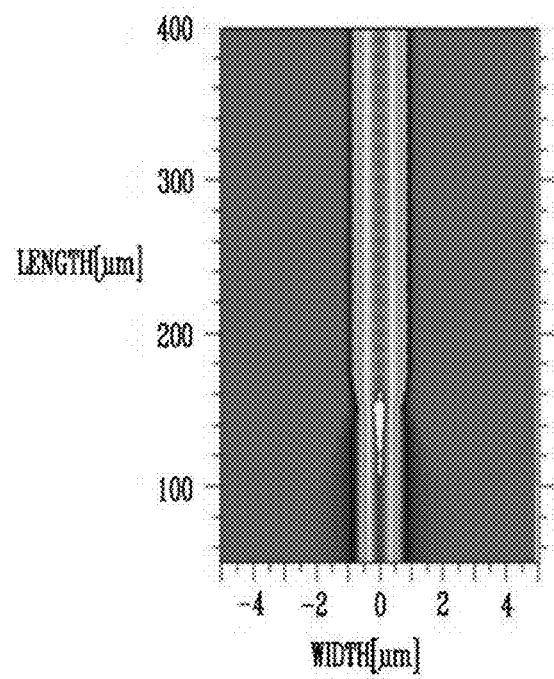
FIGS. 7A and 7B are views illustrating simulation results according to an optical axis alignment between a deep ridge waveguide and a BH waveguide.
Figure 7B:
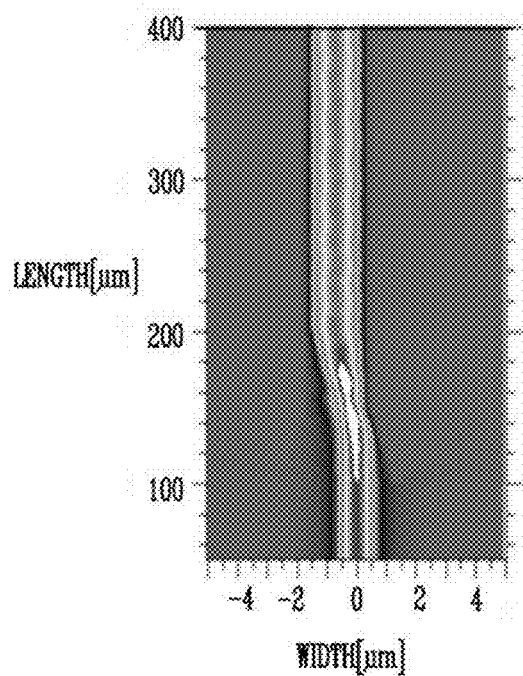

FIGS. 7A and 7B are diagrams illustrating simulation results according to optical axis alignment between a deep ridge waveguide and a BH waveguide. More specifically, FIG. 7A shows simulation results when a misalignment between optical axes of the deep ridge waveguide and the BH waveguide is 0 μm, and FIG. 7B shows simulation results when the misalignment is 0.7 μm. Referring to FIGS. 7A and 7B, according to an embodiment, even when an optical axis misalignment occurs between the BH waveguide and the deep ridge waveguide, stable transmission of an optical mode may be possible.

Figure 8:
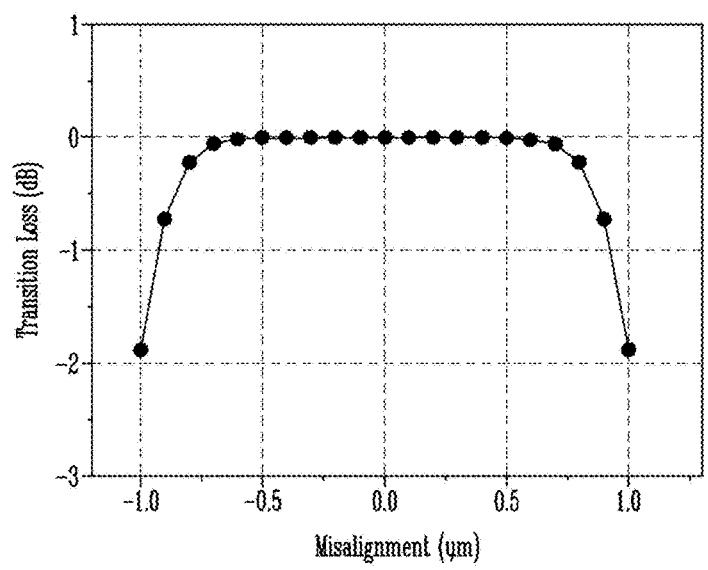
FIG. 8 is a graph illustrating optical coupling loss with respect to a misalignment between optical axes of a deep ridge waveguide and a BH waveguide.

FIG. 8 is a graph illustrating optical coupling loss with respect to a misalignment between optical axes of a deep ridge waveguide and a BH waveguide.

Referring to FIG. 8, when a horizontal misalignment between the optical axis of the BH structure and the optical axis of the deep ridge structure is ±0.7 μm, optical loss in the first mode transition region may be 0.1 dB or less. Therefore, since the BH structure and the deep ridge structure are connected by the passive waveguide proposed in the present invention, a manufacturing yield of a semiconductor optical device may be increased by increasing an allowable misalignment range between the BH structure and the deep ridge structure.

As described above, according to an embodiment, the BH structure waveguide in the optical oscillation region and the deep ridge waveguide in the optical modulation region may be connected by the passive waveguide in the first mode transition region arranged between the optical oscillation region and the optical modulation region. The passive waveguide may include a portion of the BH structure extending from the optical oscillation region and a portion of the deep ridge structure extending from the optical modulation region to suppress multi-mode light. More specifically, according to an embodiment, the width of the BH waveguide in the first transition region T1 as shown in FIG. 4 of the first mode transition region A2 as shown in FIG. 4 may be smaller than that of the deep ridge waveguide in the optical modulation region A3 as shown in FIG. 4. Accordingly, according to an embodiment, generation of multi-mode light in the first mode transition region may be suppressed. According to an embodiment, by preventing the generation of multi-mode light in the first mode transition region, optical loss caused by the horizontal misalignment between optical axes of the BH structure and the deep ridge structure may be reduced.

FIG. 9A to FIG. 13 are diagrams illustrating a method of manufacturing a semiconductor optical device according to an embodiment.

Figure 9A:
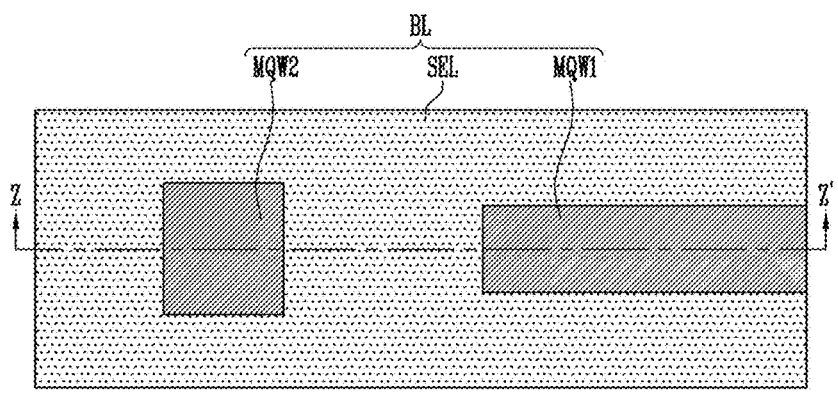
FIGS. 9A to 13 are diagrams illustrating a method of manufacturing a semiconductor optical device according to an embodiment.
Figure 9B:
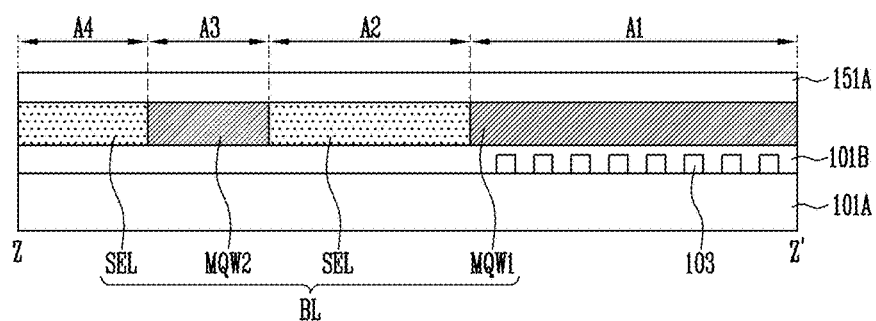

FIGS. 9A and 9B are a plan view and a cross-sectional view illustrating a butt-coupling process.

Referring to FIGS. 9A and 9B, a butt-coupled layer BL may be formed over the lower clad layers 101A and 101B in which the plurality of lattices 103 are buried.

The lower clad layers may include the first lower clad layer 101A and the second lower clad layer 101B arranged on the first lower clad layer 101A. The first lower clad layer 101A may include the optical oscillation region A1, the first mode transition region A2, the optical modulation region A3, and the second mode transition region A4 that are arranged in a row. Before the second lower clad layer 101B is formed, the plurality of lattices 103 may be formed on the first lower clad layer 101A in the optical oscillation region A1. The lattices 103 may be formed only in the optical oscillation region A1. The second lower clad layer 101B may be formed to cover the lattices 103. Each of the first and second lower clad layers 101A and 101B may include n-InP. The lattices 103 may be formed by patterning an InGaAsP layer using a lithography process.

The butt-coupled layer BL may be formed on the second lower clad layer 101B. The butt-coupled layer BL may include a first multiple quantum well layer MQW1, a compound semiconductor layer SEL, and a second multiple quantum well layer MQW2 that are butt-coupled. The first multiple quantum well layer MQW1 may overlap with the lattices 103 in the optical oscillation region A1. The second multiple quantum well layer MQW2 may be formed in the optical modulation region A3. The compound semiconductor layer SEL may be formed in the first and second mode transition regions A2 and A4. The first and second multiple quantum well layers MQW1 and MQW2 may include InGaAsP and have a multiple quantum well structure. The compound semiconductor layer SEL may include InGaAsP and be formed in a bulk structure.

To form the above-described butt-coupled layer BL, the following processes may be sequentially performed.

First, the first multiple quantum well layer MQW1 may be deposited over the second lower clad layer 101B including the lattices 103. Subsequently, the first multiple quantum well layer MQW1 may be patterned. Subsequently, the second multiple quantum well layer MQW2 may be grown by selective area growth (SAG). Subsequently, the first and second multiple quantum well layers MQW1 and MQW2 may be separated from each other by a patterning process. Subsequently, the compound semiconductor layer SEL may be grown by selective area growth (SAG).

The first upper clad layer 151A may be formed on the butt-coupled layer BL. The first upper clad layer 151A may include InP.

Figure 10:
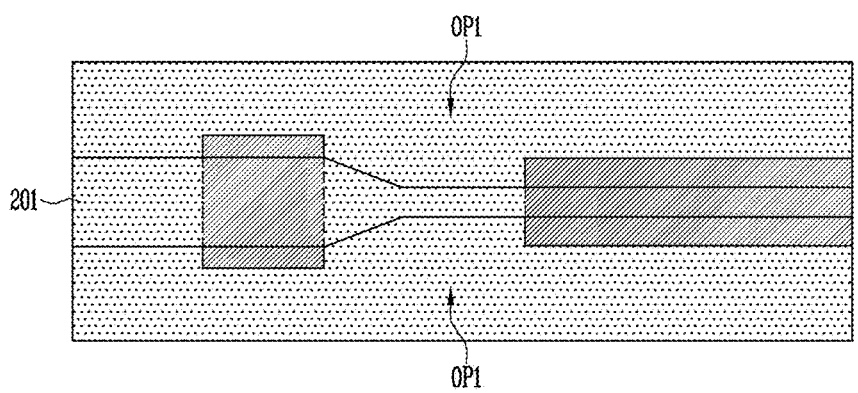

FIG. 10 is a layout view of a first mask pattern defining the shape of a preliminary core pattern.

Referring to FIG. 10, a first mask pattern 201 having a first opening OP1 may be formed on the butt-coupled layer BL covered by the butt-coupled layer BL or the first upper clad layer 151A. The butt-coupled layer BL may be partially exposed through the first opening OP1. The first mask pattern 201 may include SiNx (x is a natural number) or SiO$_2$. The first mask pattern 201 may be formed to have the same shape as a core pattern to form.

Figure 11A:
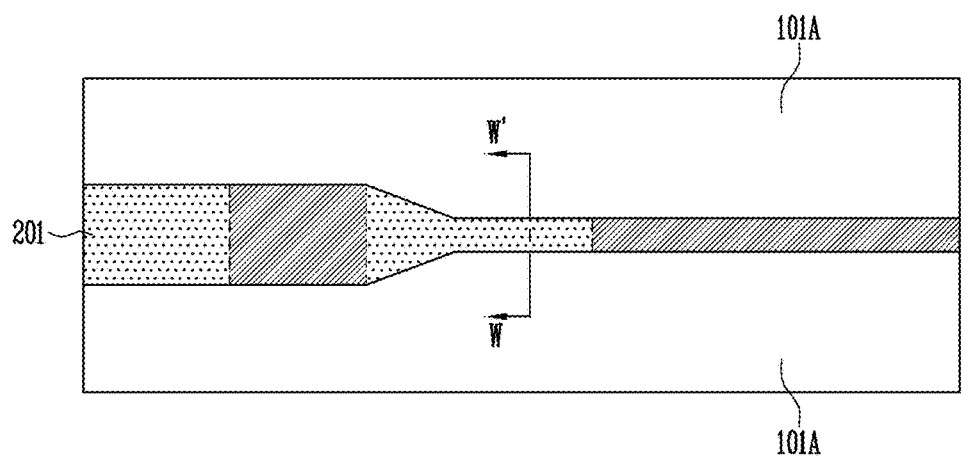
Figure 11B:
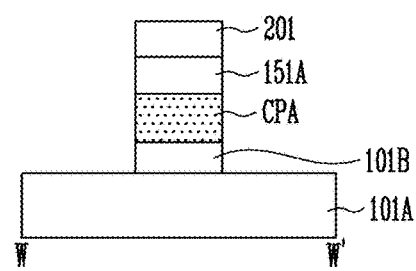
Figure 11C:
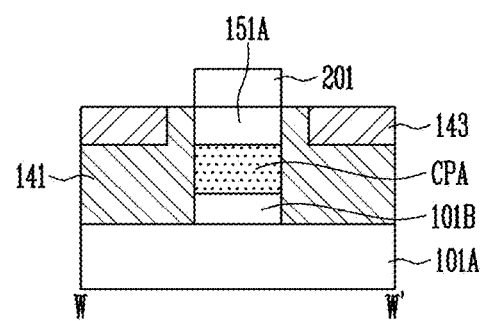

FIG. 11A and FIGS. 11B and 11C are a plan view and cross-sectional views illustrating a patterning process of a preliminary core pattern using a first mask pattern and a method of forming a current interrupting structure, respectively.

Referring to FIGS. 11A and 11B, a preliminary core pattern CPA may be formed by etching the first upper clad layer 151A, the butt-coupled layer BL, and the second lower clad layer 101B by an etch process using the first mask pattern 201 as an etch barrier. Reactive ion etching (RIE) may be used. The first lower clad layer 101A may be exposed on both sides of the preliminary core pattern CPA.

Referring to FIG. 11C, the first current interrupting clad pattern 141 and the second current interrupting clad pattern 143 may be sequentially grown. Subsequently, the first mask pattern 201 may be removed.

Figure 12A:
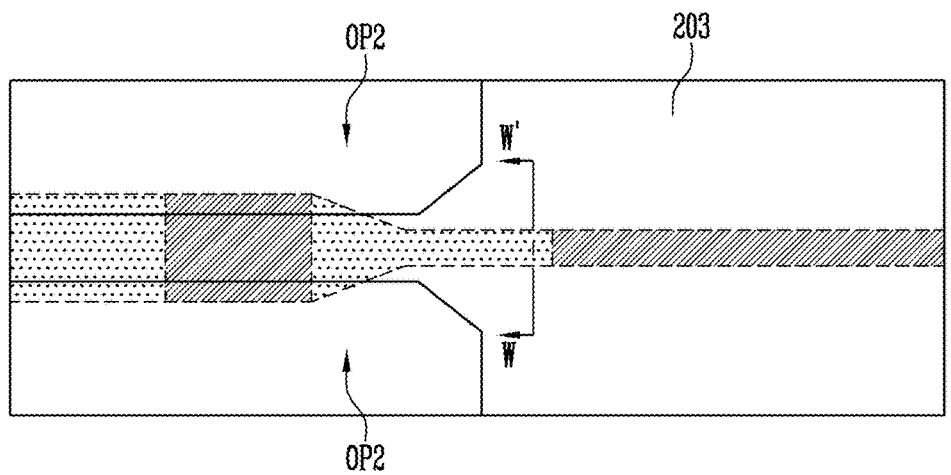
Figure 12B:
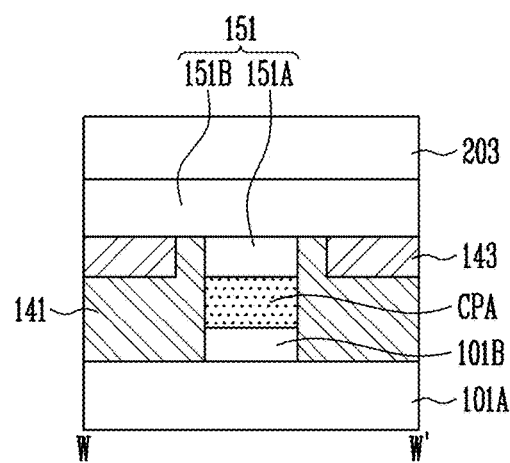

FIGS. 12A and 12B are a plan view and a cross-sectional view illustrating growth of an upper clad layer and a second mask pattern defining an upper clad pattern.

Referring to FIGS. 12A and 12B, the second upper clad layer 151B covering the first upper clad layer 151A may be formed over the first current interrupting clad pattern 141 and the second current interrupting clad pattern 143. The first current interrupting clad pattern 141 and the second upper clad layer 151B may include p-InP and the second current interrupting clad pattern 143 may include n-InP. As a result, a current interrupting structure having a PNP structure may be formed. By reducing a leakage current of a laser diode formed in the optical oscillation region through the PNP structure, low power consumption and high output characteristics may be provided. Though not shown in FIGS. 12A and 12B, a p-InGaAs ohmic layer and a p-electrode may further be formed on the second upper clad layer 151B and an n-electrode may be further formed on the lower clad layer 101A.

Subsequently, a second mask pattern 203 including a second opening OP2 may be formed over the second upper clad layer 151B and the ohmic layer. The second opening OP2 may expose a portion of the preliminary core pattern CPA. The second mask pattern 203 may have the same shape as an upper clad pattern to form. The second mask pattern 203 may include SiNx (x is a natural number) or SiO$_2$.

Figure 13:
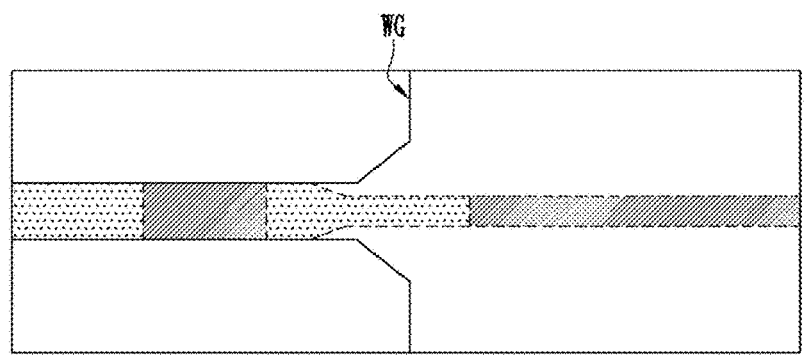

FIG. 13 is a plan view illustrating a patterning process using a second mask pattern.

Referring to FIG. 13, the optical waveguide structure WG including the BH structure and the deep ridge structure may be formed by etching the first and second upper clad layers 151A and 151B, the preliminary core pattern CPA, and the second lower clad layer 101B by an etch process using the second mask pattern 203 as an etch barrier. Inductively coupled plasma-reactive ion etch (ICP-RIE) may be used. A more detailed description of the optical waveguide structure WG will be made with reference to FIGS. 1A to 3C.

Figure 14:
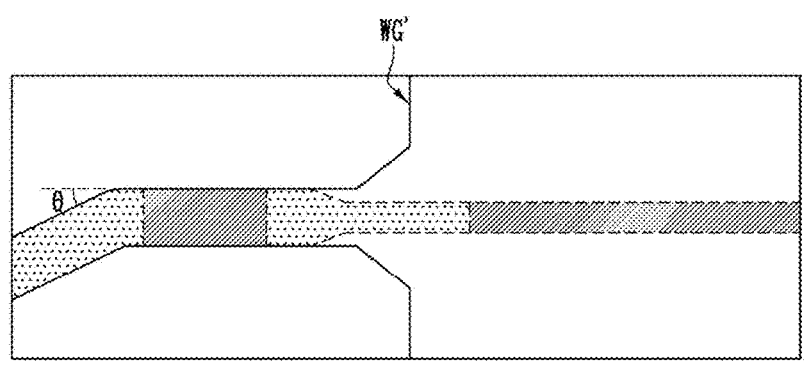
FIG. 14 is a plan view illustrating a semiconductor optical device according to another embodiment.

FIG. 14 is a plan view illustrating a semiconductor optical device according to another embodiment.

Referring to FIG. 14, an optical waveguide structure WG' of a semiconductor optical device according to another embodiment may be inclined in a horizontal direction at an optical output in comparison with the above-described embodiment with reference to FIGS. 1 to 3C. The optical output of an optical waveguide structure WG' may be inclined at an angle of θ with respect to the optical axis, and θ may be 5 to 20°. By forming the inclined optical output of the optical waveguide structure WG', facet reflection may be reduced.

Figure 15A:
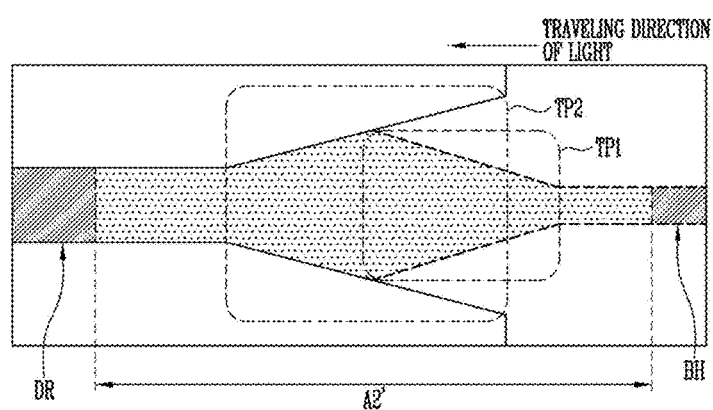
FIGS. 15A to 15C are views illustrating the effects of an embodiment.
Figure 15B:
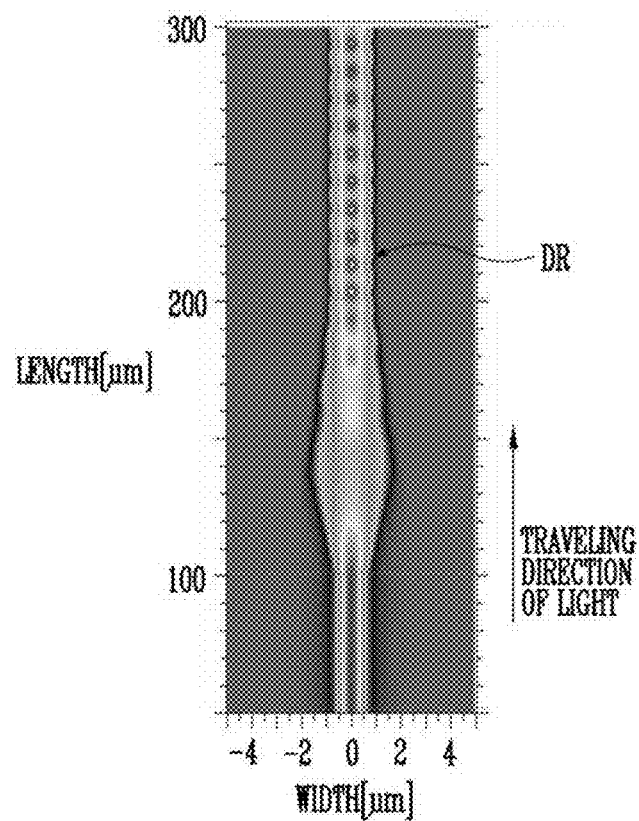
Figure 15C:
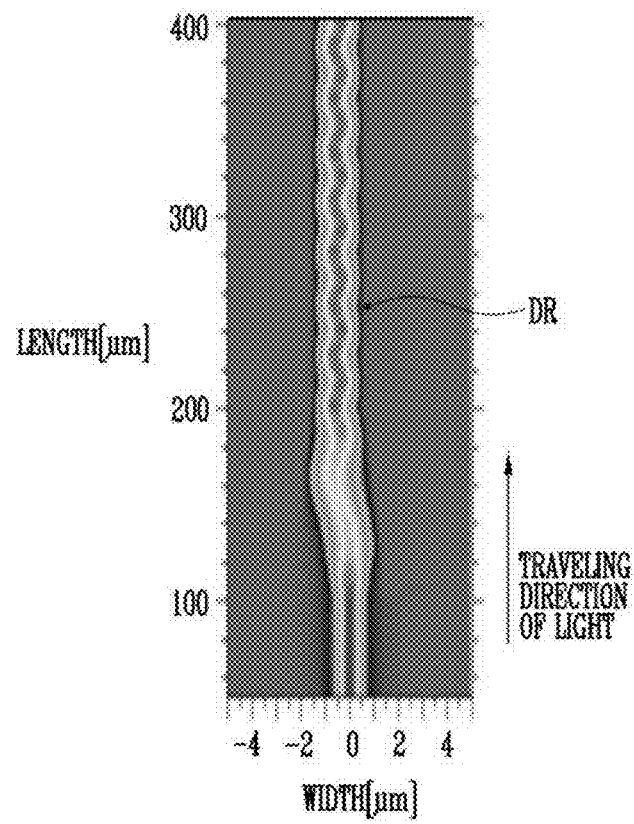

FIGS. 15A to 15C are views illustrating the effects of the embodiments of the invention.

FIG. 15A is a plan view illustrating a passive waveguide having a different structure from the embodiments of the invention.

Referring to FIG. 15A, an optical waveguide may include a deep ridge structure DR and a BH structure BH.

It may be easy to manufacture the BH structure BH as a single mode light waveguide because of low optical confinement factor characteristics. On the other hand, it may be difficult to manufacture the deep ridge structure DR as a single mode light waveguide having a small width because of high optical confinement factor characteristics. In addition, when an electro-absorption modulator of the deep ridge structure DR is manufactured to have a very small waveguide width, an extinction ratio may be low. Thus, the optical waveguide width of the deep ridge structure DR applied to a device, such as an electroabsorption modulated laser, may be manufactured to have a greater width than the single mode waveguide of the BH structure BH. When an unstable optical mode is incident on the waveguide of the deep ridge structure DR, multi-mode light may be generated in the waveguide. As a result, optical loss in the waveguide may be increased, and multi-mode light may pass through the second mode transition region A4 as shown in FIGS. 1 and 2, and then be output to increase optical coupling loss with an external optical waveguide. The cause of the generation of the multi-mode light is described in more detail.

The deep ridge structure DR and the BH structure BH may be connected in a first mode transition region A2'. The first mode transition region A2' may include a passive waveguide having a different structure from an embodiment of the invention. More specifically, the BH structure BH may include a first taper pattern TP1 increasing in width along a traveling direction of light, and the deep ridge structure DR may include a second taper pattern TP2 decreasing in width along the traveling direction of light. The first taper pattern TP1 and the second taper pattern TP2 may overlap with each other in the first mode transition region A2'. Since evanescent optical coupling may occur in the deep ridge structure DR having a relatively large width, it may be difficult to suppress multi-mode light.

The multi-mode light generated in the first mode transition region A2' having the configuration as shown in FIG. 15A may guide an unstable optical mode to the optical modulation region A3 as shown in FIGS. 1 and 2 and the second mode transition region A4 as shown in FIGS. 1 and 2.

FIGS. 15B and 15C are views showing simulation results according to an optical axis alignment between the deep ridge waveguide and the BH waveguide as shown in FIG. 15A. More specifically, FIG. 15B shows simulation results when a misalignment between optical axes of the deep ridge waveguide and the BH waveguide is 0 µm, and FIG. 15C shows simulation results when the misalignment is 0.5 µm.

Referring to FIGS. 15B and 15C, it can be seen that an optical mode is unstably guided by the optical waveguide of the deep ridge structure DR. In addition, instability of the optical mode may increase as the optical axis misalignment increases.

In comparison with the case in which the passive waveguide is configured as shown in FIG. 15A, when the passive waveguide is configured according to the embodiments of the invention, optical loss may be reduced. The passive waveguide according to the embodiments of the invention may reduce generation of multi-mode light by the BH waveguide arranged in a region where the deep ridge waveguide is reduced in width and having a smaller width than the deep ridge waveguide of the optical modulation region.

According to embodiments, a connecting portion between a waveguide having a BH structure and a waveguide having a deep ridge structure may be formed as a passive waveguide. The passive waveguide according to an embodiment may provide a moving path for single mode light oscillated in an optical oscillation region, reduces excitation of single mode light to multi-mode light, and induces evanescent optical coupling of light incident on the optical modulation region of the deep ridge structure. Therefore, according to an embodiment, since an allowable alignment error range between the waveguide having the BH structure and the waveguide having the deep ridge structure may be increased, optical coupling loss between the waveguide of the BH structure and the waveguide of the deep ridge structure may be reduced, optical coupling efficiency may be increased, and single mode characteristics may be maintained. As a result, according to an embodiment, a manufacturing yield of an integrated semiconductor optical device may be increased.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor optical device, comprising:
   a BH waveguide including lattices buried therein and having a buried hetero (BH) structure formed in an optical oscillation region in which single mode light is oscillated;
   a deep ridge waveguide having a deep ridge structure formed in an optical modulation region; and
   a passive waveguide formed in a mode transition region interposed between the optical oscillation region and the optical modulation region, formed as a connecting structure of the BH waveguide extending from the optical oscillation region and the deep ridge waveguide extending from the optical modulation region, and inducing evanescent optical coupling,
   wherein a width of the BH waveguide in the mode transition region is smaller than a width of the deep ridge waveguide in the optical modulation region.

2. The semiconductor optical device of claim 1, wherein in the mode transition region, the BH waveguide comprises:
   a first portion extending from the optical oscillation region and having a uniform width;
   a second portion extending from the first portion and having a width decreasing toward the optical modulation region; and
   a third portion extending from the second portion so as to be connected to the deep ridge waveguide extending from the optical modulation region and having a width increasing toward the deep ridge waveguide.

3. The semiconductor optical device of claim 2, wherein the single mode light passes through the second portion to have a smaller optical spot size, passes the third portion, and forms the evanescent optical coupling in the deep ridge waveguide.

4. The semiconductor optical device of claim 1, wherein each of the BH waveguide and the deep ridge waveguide comprises:
   a core pattern extending along the optical oscillation region, the mode transition region, and the optical modulation region;

a lower clad pattern formed under the core pattern; and
an upper clad pattern formed over the core pattern.

5. The semiconductor optical device of claim 4, wherein the core pattern comprises:
 a first core portion having a multiple quantum well structure arranged in the optical oscillation region;
 a second core portion butt-coupled to the first core portion and having a bulk structure arranged in the mode transition region; and
 a third core portion butt-coupled to the second core portion and having a multiple quantum well structure arranged in the optical modulation region.

6. The semiconductor optical device of claim 5, wherein the second core portion includes a first taper structure decreasing in width toward the optical oscillation region, and
 the upper clad pattern includes a second taper structure having a width decreasing toward the optical modulation region and arranged in the mode transition region so as to be closer to the optical oscillation region than the first taper structure.

7. The semiconductor optical device of claim 4, wherein the core pattern includes InGaAsP.

8. The semiconductor optical device of claim 4, further comprising a current interrupting structure surrounding a portion of the core pattern forming the BH waveguide.

9. The semiconductor optical device of claim 8, wherein the current interrupting structure comprises:
 the upper clad pattern;
 a first current interrupting clad pattern arranged between the upper clad pattern and the lower clad pattern and formed along a shape of an upper surface of the lower clad pattern and a shape of a sidewall of the core pattern; and
 a second current interrupting clad pattern arranged between the first current interrupting clad pattern and the upper clad pattern.

10. The semiconductor optical device of claim 9, wherein the first current interrupting clad pattern, the second current interrupting clad pattern, and the upper clad pattern form the current interrupting structure having a PNP structure.

11. The semiconductor optical device of claim 1, wherein the deep ridge waveguide is patterned to be horizontally inclined at an optical output.

12. The semiconductor optical device of claim 1, wherein a distributed feedback laser diode is formed in the optical oscillation region, and
 an electro-absorption modulator is formed in the optical modulation region.

* * * * *